US008568866B2

(12) United States Patent
Ni et al.

(10) Patent No.: US 8,568,866 B2
(45) Date of Patent: Oct. 29, 2013

(54) MULTILAYER NITRIDE HARD COATINGS

(71) Applicant: Kennametal Inc., Latrobe, PA (US)

(72) Inventors: Wangyang Ni, Latrobe, PA (US);
Yixiong Liu, Greensburg, PA (US);
Mark S Greenfield, Greensburg, PA (US);
Ronald M Penich, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 0 days.

(21) Appl. No.: 13/764,457

(22) Filed: Feb. 11, 2013

(65) Prior Publication Data
US 2013/0157023 A1    Jun. 20, 2013

Related U.S. Application Data

(63) Continuation of application No. 12/789,514, filed on May 28, 2010, now Pat. No. 8,409,695.

(51) Int. Cl.
*B32B 9/00*    (2006.01)

(52) U.S. Cl.
USPC ............ 428/216; 51/307; 51/309; 428/336; 428/697; 428/698; 428/699

(58) Field of Classification Search
USPC .......... 428/307, 309, 216, 336, 697, 698, 699
See application file for complete search history.

(56) References Cited

U.S. PATENT DOCUMENTS

| 4,268,569 | A  | 5/1981  | Hale |
| 5,700,551 | A  | 12/1997 | Kukino et al. |
| 6,231,969 | B1 | 5/2001  | Knight et al. |
| 6,342,291 | B1 | 1/2002  | Jonsson et al. |
| 6,395,379 | B1 | 5/2002  | Braendie |
| 6,586,122 | B2 | 7/2003  | Ishikawa et al. |
| 7,060,345 | B2 | 6/2006  | Fukui et al. |
| 7,923,130 | B2 | 4/2011  | Shibata et al. |
| 8,003,232 | B2 | 8/2011  | Johansson et al. |
| 8,119,262 | B2 | 2/2012  | Astrand |
| 2004/0219395 | A1 | 11/2004 | Imamura et al. |
| 2009/0067938 | A1 | 3/2009 | Omori et al. |
| 2009/0130465 | A1 | 5/2009 | Vetter et al. |

FOREIGN PATENT DOCUMENTS

| EP | 0310042 B1 | 4/1994 |
| EP | 0592986 B1 | 7/1998 |

(Continued)

OTHER PUBLICATIONS

ISA/KR, PCT Written Opinion and International Search Report for PCT/US2011/029153 mailed Nov. 1, 2011.

*Primary Examiner* — Archene Turner
(74) *Attorney, Agent, or Firm* — Matthew W. Gordon, Esq.

(57) ABSTRACT

A wear resistant multilayer nitride hard coating for substrates. The hard coating includes a first layer of titanium aluminum nitride and a second layer comprising a plurality of sublayer groups. Each sublayer group includes a first sublayer of titanium silicon nitride and a second sublayer of titanium aluminum nitride. The composition of the titanium aluminum nitride, both in the first layer and in the sublayer groups, is $(Ti_xAl_{1-x})N$, wherein $0.4 \le x \le 0.6$. The composition of the titanium silicon nitride sublayers is $(Ti_ySi_{1-y})N$, wherein $0.85 \le y \le 0.98$, and all of the silicon is in solid solution in the titanium silicon nitride such that no silicon phase or silicon nitride phase exists in this sublayer. The combined amount of aluminum and silicon present in the sublayer groups being narrowly controlled such that the sum of x and y is in the range of 1.38 to 1.46.

32 Claims, 3 Drawing Sheets

(56) References Cited

FOREIGN PATENT DOCUMENTS

| | | |
|---|---|---|
| EP | 2100985 A1 | 9/2009 |
| EP | 2156912 A1 | 2/2010 |
| JP | 2000-326108 | 11/2000 |
| JP | 2000334606 A | 12/2000 |
| JP | 2000334607 A | 12/2000 |
| JP | 2003-089004 | 3/2003 |
| JP | 2006-137982 | 11/2004 |
| JP | 2006-225708 | 8/2006 |
| JP | 2008-093760 A | 4/2008 |

# MULTILAYER NITRIDE HARD COATINGS

RELATED APPLICATION DATA

Pursuant to 35 U.S.C. §120, the present application is a continuation application of U.S. patent application Ser. No. 12/789,514, filed May 28, 2010.

FIELD OF THE INVENTION

The invention relates to multilayer nitride hard coatings for substrates. More particularly, the invention relates to hard coatings having a first layer of titanium aluminum nitride and a second layer comprising groups of alternating sublayers of titanium silicon nitride and titanium aluminum nitride. The invention also relates to coated articles having such hard coatings and to methods of making the hard coatings and the hard coated articles.

BACKGROUND OF THE INVENTION

For several decades, hard coatings have been applied to various types of articles to improve their resistance to wear in order to extend their operational lives. Hard coatings are commonly applied to cutting tools and wear-resistant components. Over the years, a great deal of effort has gone into the discovery of new hard coatings with improved properties.

For example, U.S. Pat. No. 7,060,345 to Fukui et al. teaches a hard coating which comprises one or more first layers composed of a lubricating compound selected from nitrides, carbides, carbonitrides, oxynitrides and carbonitrides of titanium silicon, and one or more second layers of a hard compound selected from the nitrides, carbides, and carbonitrides of a metal selected from the titanium, chromium, and a titanium chromium alloy. The first and second layers may be repeatedly deposited one upon the other to make up a hard coating made up of a plurality of alternating lubricating and hard layers.

U.S. Pat. No. 6,586,122 to Ishikawa et al. also teaches the use of a multilayer hard coating on a cutting tool. In this case, the multilayer hard coating includes a first layer comprising one or metallic elements selected from the group consisting of titanium, aluminum, and chromium, and one or more nonmetallic elements selected from the group consisting of nitrogen, boron, carbon, and oxygen, and a second layer comprising silicon and one or more metallic elements selected from the group consisting of metallic elements of Group 4a, 5a, and 6a of the Periodic Table, and aluminum, and one or more nonmetallic elements selected from the group consisting of nitrogen, boron, carbon and oxygen. This second layer has a structure in which a silicon-rich phase is dispersed in a matrix phase containing a relatively small amount of silicon. The silicon-rich phase may be amorphous or crystalline silicon nitride or silicon and is formed by using a substrate temperature in the range of about 300 to 500° C. in conjunction with a substrate bias voltage that periodically changes between different levels of negative voltage or between positive and negative voltages.

Similarly, Japanese Unexamined Patent Publication 2000-334606 teaches a multilayer hard coating in which the hard coating comprises alternating layers of titanium aluminum nitride and titanium silicon nitride. The titanium aluminum nitride layers contain 40 to 75 atom percent aluminum. The titanium silicon nitride layers contain 10 to 60 atom percent silicon. The titanium silicon nitride layers contain independent phases of silicon and silicon nitride. A companion to this application, i.e., Japanese Unexamined Patent Publication 2000-334607, contains teachings of almost identical hard coatings, except it makes no mention of independent phases of silicon or silicon nitride. Instead, it describes the titanium silicon nitride layer as having a sodium chloride crystal structure, even though the hard coating compositions disclosed in this application are the same as those disclosed in its companion application. Comparing the two companion applications, it appears that the substrate-biasing voltage applied during the physical vapor deposition of the hard coatings is what is used to control the structure of the titanium silicon nitride coating. A low value negative bias voltage (−30 V) is used to create titanium silicon nitride layers which contain independent phases of silicon and silicon nitride, whereas a much higher negative bias voltage (−100 V) is used to create titanium silicon nitride layers having only the sodium chloride crystal structure. In both applications, the hard coatings are formed using substrate temperatures of no greater than 400° C.

Nonetheless, as production rates increase and efforts to provide manufacturing economic efficiencies intensify, there continues to be a need for longer-lasting, more wear resistant cutting tools and wear components. It is an object of the present invention to address that need.

SUMMARY OF THE INVENTION

The inventors of the present invention discovered a hard coating that has surprisingly improved wear resistance. The present invention provides a hard coating comprising a first layer of titanium aluminum nitride and a second layer comprising a plurality of sublayer groups. Each of the sublayer groups comprises a first sublayer of titanium silicon nitride and a second sublayer of titanium aluminum nitride. The composition of the titanium aluminum nitride, both in the first layer and in the sublayer groups, is given by the formula $(Ti_xAl_{1-x})N$, wherein $0.4 \leq x \leq 0.6$. The composition of the titanium silicon nitride sublayers is given by the formula $(Ti_ySi_{1-y})N$, wherein $0.85 \leq y \leq 0.98$. The inventors of the present invention have made the surprising discovery that the improved wear resistance of the hard coating is dependent on the combined amount of aluminum and silicon present in the sublayer groups being narrowly controlled such that the sum of x and y is in the range of 1.38 to 1.46.

The present invention also includes articles comprising such hard coatings and methods of making the hard coatings and the hard coated articles.

BRIEF DESCRIPTION OF THE DRAWINGS

The criticality of the features and merits of the present invention will be better understood by reference to the attached drawings. It is to be understood, however, that the drawings are designed for the purpose of illustration only and not as definitions of the limits of the present invention.

DESCRIPTION OF PREFERRED EMBODIMENTS OF THE INVENTION

In this section, some preferred embodiments of the present invention are described in detail sufficient for one skilled in the art to practice the present invention. It is to be understood, however, that the fact that a limited number of preferred embodiments are described herein does not in any way limit the scope of the present invention as set forth in the appended claims.

Figure 1:
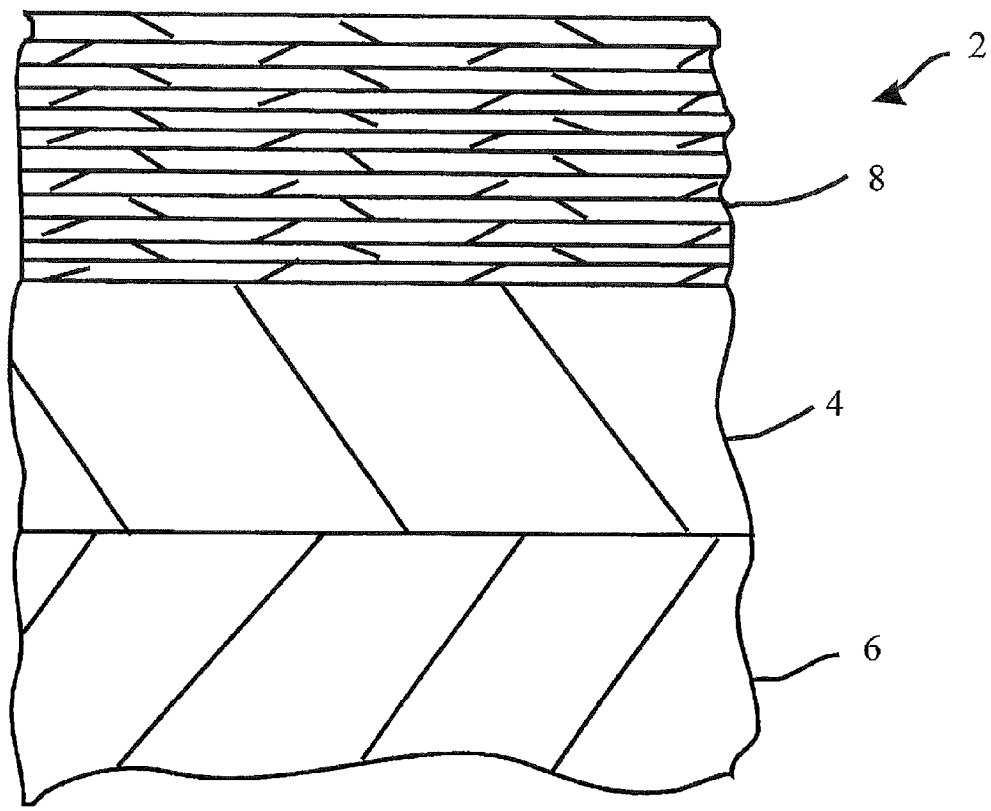
FIG. 1 is a schematic drawing of a hard coating according to an embodiment of the present invention.
Figure 2:
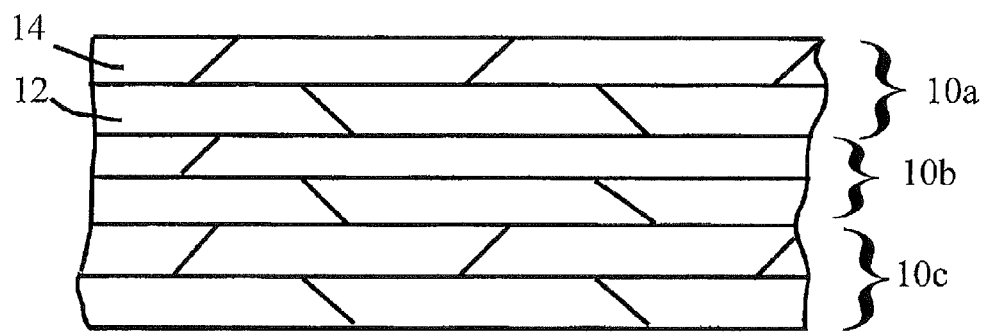
FIG. 2 is a schematic drawing depicting three sublayer groups of the second layer of the hard coating of FIG. 1.

Referring to FIG. 1, there is shown a schematic representation of a hard coating 2 according to an embodiment of the present invention. As shown, the hard coating 2 consists of a first layer 4 attached to a substrate 6 and a second layer 8. The second layer 8 comprises a plurality of adjacently stacked sublayer groups, e.g., sublayer groups 10a, 10b, 10c, shown in FIG. 2. Each such sublayer group, e.g., sublayer group 10a includes a first sublayer 12 and a second sublayer 14.

The composition of the first layer 4 and each second sublayer 14 is titanium aluminum nitride of the formula $(Ti_xAl_{1-x})N$, wherein $0.4 \leq x \leq 0.6$. Nonetheless, it is to be understood that the composition of the first layer need not be identical to that of any particular titanium aluminum nitride sublayer. To help avoid confusion, in the claims, the composition of the first layer is denoted in the claims by the formula $(Ti_zAl_{1-z})N$ wherein $0.4 \leq z \leq 0.6$. Additionally, it is to be understood that the compositions of the titanium aluminum nitride sublayers need not be identical with one another. Titanium aluminum nitride compositions outside of this range have inferior hardness and internal stress levels. The first layer 4 and each second sublayer 14 have crystal structures which are face centered cubic or a combination of face centered cubic and hexagonal close packed.

The composition of each sublayer 12 is titanium silicon nitride of the formula $(Ti_ySi_{1-y})N$, wherein $0.85 \leq y \leq 0.98$. Nonetheless, it is to be understood that the compositions of the titanium silicon nitride sublayers need not be identical with one another. Titanium silicon nitride compositions having less silicon have inferior hardness levels, whereas those having greater silicon levels are prone to the formation of secondary phases of amorphous silicon and/or silicon nitride, both of which have deleterious effects upon the toughness of the hard coating.

The inventors of the present invention have made the surprising discovery that the wear resistance of the hard coating depends on the combined amount of aluminum and silicon present in each of the sublayer groups. More particularly, they have found that the sum the x in the formula $(Ti_xAl_{1-x})N$ and the y in the formula $(Ti_ySi_{1-y})N$, is to be controlled within the narrow range 1.38 to 1.46. Sums above and below this range give inferior levels of wear resistance. Preferably, the sum is between 1.39 and 1.45, in order to further optimize the wear resistance.

The thickness of hard coatings according to the present invention are preferably in the range of between about 1 to about 10 microns, and more preferably in the range of between about 2 to about 6 microns. Preferably, the first layer of the hard coating comprises between about 20 and 60 percent of the total thickness of the hard coating. Relative first layer thicknesses outside this range provide inferior combinations of adhesion and wear resistance to the hard coating.

The thicknesses of the individual sublayers of the second sublayer groups of the hard coatings of the present invention are preferably in the range of about 1 to about 15 nanometers. For lesser thicknesses, it is difficult to maintain the stability of the sublayer. The ratio of the thicknesses of the first and second sublayers within a sublayer group is preferably in the range of about 0.2 to about 2 so as to provide the hard coating the optimum combination of hardness and toughness. The numerical value of this ratio may be the same or vary from sublayer group to sublayer group.

The sublayer group thickness in hard coatings of the present invention is preferably in the range of from about 2 to about 20 nanometers, and more preferably in the range of about 3 to about 10 nanometers. The sublayer group thickness may vary from sublayer group to sublayer group. Sublayer group thicknesses outside of these ranges are subject to the difficulties described above for the sublayer thicknesses outside of their preferred ranges. The thicknesses of the sublayer groups in combination with number of sublayer groups help to determine the overall thickness of the second layer. In some preferred embodiments, the number of sublayer groups is 200 or more.

Figure 3:
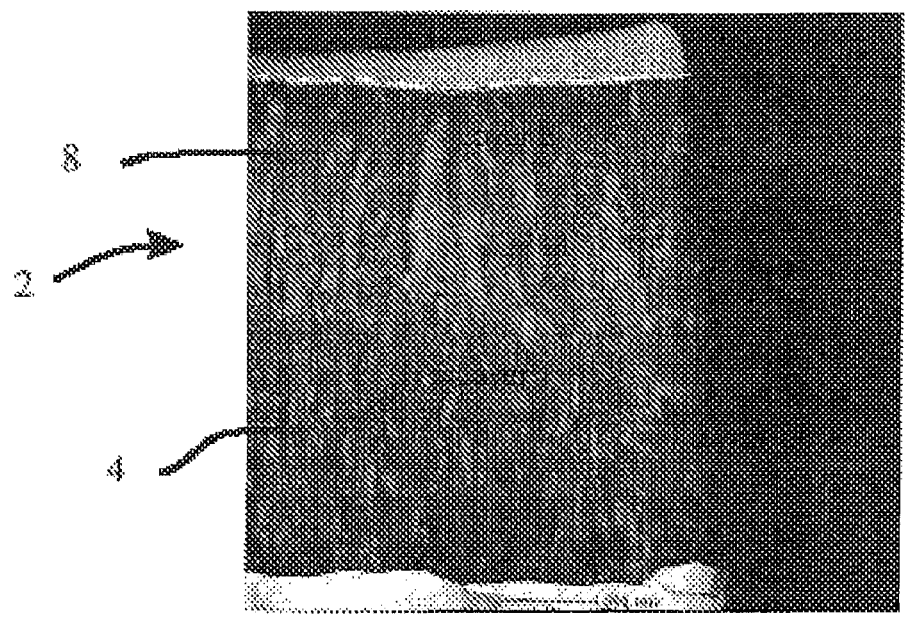
FIG. 3 is a photomicrograph taken by transmission electron microscopy of a cross-section of a hard coating according to an embodiment of the present invention.
Figure 4:
FIG. 4 is a photomicrograph taken at a higher magnification of the second layer of the hard coating of FIG. 2.

Referring to FIG. 3, there is shown a transmission electron microscopy photomicrograph of a cross-section of a hard coating according to an embodiment of the present invention. Although it is difficult to discern in this photomicrograph, the lower portion of the hard coating 2 is a single-layer first layer 4 of titanium aluminum nitride and the upper portion is a multilayer second layer 6 consisting of a plurality of sublayer groups having a sublayer of titanium silicon nitride and a sublayer of titanium aluminum nitride. FIG. 4 shows the multilayer second layer 8 shown in FIG. 3 at a higher magnification so that the individual first and second sublayers 12, 14 are discernable. In this embodiment of the present invention, each sublayer group 10 is approximately 5 nanometers thick.

It is within the contemplation of the present invention that layers or sublayers in addition to those described above may be included in the hard coating. For example, a layer or sublayer may be interposed between the substrate and the first layer of the hard coating. Additional layers or sublayers may be deposited over the second layer of the hard coating. These additional layers or sublayers may be of any desired thickness and composition. Preferably the thicknesses of such additional layers is in the range of 50 to 600 nanometers and the thicknesses of such additional sublayers is in the range of 10 to 1000 nanometers. The compositions of such additional layers and sublayers are preferably Ti, Cr, TiN, TiAlN, CrN, TiAlCrN, AlCrN, TiAlSiN, AlCrSiN, and TiAlCrSiN.

The present invention also includes articles having the inventive hard coatings described above. The articles are preferably machining tools and wear resistant components, but may be any kind of article known to persons skilled in the art to which a physical vapor deposited hard coating may be beneficial for extending its service life by improving its oxidation resistance and/or resistance to wear. The articles preferably comprise cemented tungsten carbides, cermets, steels (especially high-speed steels), ceramics, cubic boron nitride, polycrystalline diamond, silicon nitride, alumina, and aluminum nitride-titanium. Illustrative examples of such articles include drills, end mills, indexable inserts for milling or turning, metal slitting saws, gear cutting tools, reamers, taps, and subterranean drill bits and punches, die, and mold.

The present invention also includes methods of making having the inventive hard coatings described above. Such methods comprise the steps of physical vapor depositing on a surface a first layer of titanium aluminum nitride and then physical vapor depositing upon the first layer a plurality of sublayer groups, each of which has of a first sublayer of titanium silicon nitride and a second sublayer of titanium aluminum nitride, such that the overall thickness of the hard coating is between about 1 and 10 microns, the first layer makes up about 20 to 60 percent of the overall thickness, and each group of sublayers is between about 2 and 20 nanometers thick. The ratio of the thicknesses of the first and second sublayers within a sublayer group is preferably in the range of about 0.2 to about 2. The thicknesses of the alternating sublayers of titanium silicon nitride and titanium aluminum nitride of the sublayer groups of the second layers of the hard coatings may be controlled by adjusting the substrate rotation speed, and the target evaporation rates. The compositions of the titanium aluminum nitride layers and sublayers and of the titanium silicon nitride sublayers are those described above with regard to the inventive hard coating. Any physical vapor deposition process known to persons skilled in the art may be used, but the magnetron sputtering and cathodic arc evaporation processes are preferred. The surface upon which the first layer is deposited may be that of the substrate or another coating that has been applied to the substrate. The method may also comprise depositing one or more additional layers or sublayers above or below the first and second layers. Examples of such additional layers have already been described in the discussion of additional layers or sublayers which may be part of the inventive hard coating.

The present invention also includes methods of making the inventive coated articles described above. Such methods comprise the steps of providing the article to be coated, physical vapor depositing upon at least a portion a surface of the article a first layer comprising titanium aluminum nitride and then physical vapor depositing upon the first layer a plurality of sublayer groups, each of which has of a first sublayer of titanium silicon nitride and a second sublayer of titanium aluminum nitride, such that the overall thickness of the hard coating is between about 1 and 10 microns, the first layer makes up about 20 to 60 percent of the overall thickness, and each group of sublayers is between about 2 and 20 nanometers thick. The ratio of the thicknesses of the first and second sublayers within a sublayer group is preferably in the range of about 0.2 to about 2. The compositions of the titanium aluminum nitride layers and sublayers and titanium silicon nitride sublayers are those described above with regard to the inventive hard coating. Any physical vapor deposition process known to persons skilled in the art may be used, but the magnetron sputtering and cathodic arc evaporation processes are preferred. The surface upon which the first layer is deposited may be that of the substrate or another coating that has been applied to the substrate. The surface, or any portion thereof, of the article to which the hard coating is deposited may already have a coating such that the hard coating is deposited upon that coating. The method may also comprise depositing one or more additional layers or sublayers above or below the first and second layers. Examples of such additional layers have already been described in the discussion of additional layers or sublayers which may be part of the inventive hard coating.

EXAMPLES

Examples of hard coatings of the present invention which are identified in Table 1 as Examples 1-7. These hard coatings were physical vapor deposited by the cathodic arc evaporation process upon cemented carbide (WC—Co) using substrate temperature of 450 to 550° C. and biasing voltage of −40 to −60 V. Each sublayer group of the second layer had a thickness of about 5 nanometers and a ratio of the thickness of the titanium silicon nitride layer to the thickness of the titanium aluminum nitride of approximately 0.47.

For comparison, a commercial titanium aluminum nitride unilayer hard coating was deposited under similar conditions. The characteristics of this hard coating are reported in Table 1. The chemical compositions reported in Table 1 were measured on representative samples of the first layers and the second layers using scanning electron microscopy with electron dispersive spectroscopy at 20 keV.

TABLE 1

| | First Layer | | | Second Layer | | | | | | |
|---|---|---|---|---|---|---|---|---|---|---|
| | | | | First Sublayer | | | Second Sublayer | | | |
| ID | Ti | Al | First Layer Thickness (nm) | Ti | Si | First Sublayer Thickness (nm) | Ti | Al | Second Sublayer Thickness (nm) | Second Layer Thickness (nm) | Hard coating Thickness (mm) |
| Ex. 1 | 0.52 | 0.48 | ~1700 | 0.89 | 0.11 | 3.4 | 0.52 | 0.48 | 1.6 | ~1700 | 3.4 |
| Ex. 2 | 0.49 | 0.51 | ~1700 | 0.89 | 0.11 | 3.4 | 0.49 | 0.51 | 1.6 | ~1700 | 3.4 |
| Ex. 3 | 0.52 | 0.48 | ~1700 | 0.93 | 0.07 | 3.4 | 0.52 | 0.48 | 1.6 | ~1700 | 3.4 |
| Ex. 4 | 0.49 | 0.51 | ~1700 | 0.93 | 0.07 | 3.4 | 0.49 | 0.51 | 1.6 | ~1700 | 3.4 |
| Ex. 5 | 0.47 | 0.53 | ~1700 | 0.89 | 0.11 | 3.4 | 0.47 | 0.53 | 1.6 | ~1700 | 3.4 |
| Ex. 6 | 0.47 | 0.53 | ~1700 | 0.93 | 0.07 | 3.4 | 0.47 | 0.53 | 1.6 | ~1700 | 3.4 |
| Ex. 7 | 0.47 | 0.53 | ~1700 | 0.97 | 0.03 | 3.4 | 0.47 | 0.53 | 1.6 | ~1700 | 3.4 |
| Comp. | 0.4 | 0.61 | ~3400 | — | — | — | — | — | — | 0 | 3.4 |

X-ray diffraction at 45 keV was used to determine the crystal structure of the first layers and 200 keV transmission electron microscopy selected area diffraction (employing a selected area of 1.5 microns) was used to determine the crystal structure of the second layers. In each case, the analysis was done on a representative sample of the relevant first or second layer. No rings or patterns indicating independent amorphous or crystalline silicon or silicon nitride phases were detected in the samples of the second layers. The samples of the first layers of Examples 1-4 were determined to be all face centered cubic, while those of Examples 5-7 were found to be a mixture of face centered cubic and hexagonal close packed. The comparative sample was found to have a crystal structure of a mixture of face centered cubic and hexagonal close packed.

The hardness of the hard coatings was measured by the nanoindentation method according to ISO 14577. The results of the measurements are presented in Table 2. As can be seen, each of the hard coatings of the present invention is significantly harder than the comparison hard coating.

TABLE 2

| Hard coating ID | Hard coating Hardness (GPa) |
|---|---|
| 1 | 32.0 |
| 2 | 32.1 |
| 3 | 31.6 |
| 4 | 32.1 |
| 5 | 31.5 |
| 6 | 30.8 |
| 7 | 33.6 |
| Comp. | 28.3 |

Metal cutting tests were performed using the conditions identified to evaluate the cutting performance of the hard coatings. Turning tests were conducted using the conditions reported in Table 3 to evaluate the performance of the hard coatings under continuous cutting conditions. Face milling tests were conducted to evaluate the performance of the hard coatings under interrupted cutting conditions. The conditions for the face milling tests are given in Table 4. Table 4 also presents the sum, x+y, for the second layer subgroups for Examples 1-7.

TABLE 3

| Test No. | Workpiece Material | Insert Style | Speed (m/sec) | Feed (mm/rev.) | Depth of Cut (mm) | Coolant Conditions | End of Life Criterion |
|---|---|---|---|---|---|---|---|
| 1 | 304 stainless steel | CNMG432MP | 3.556 | 0.254 | 2.032 | Flood | Flank wear exceeds 0.3048 mm |
| 2 | 4140 steel | CNMG432MP | 3.048 | 0.3048 | 1.016 | Flood | Flank wear exceeds 0.3048 mm |

TABLE 4

| Test No. | Workpiece Material | Insert Style | Miller Cutter Body | Speed (m/sec) | Feed per Tooth (mm) | Tool Dia. (mm) | Axial Depth of Cut (mm) | Radial Depth of Cut (mm) | Coolant Conditions | End of Life Criterion |
|---|---|---|---|---|---|---|---|---|---|---|
| 3 | 304 Stainless Steel | HNPJ-0905-ANSN-GD | KSHR-063A-06RS-45HN-09 | 2.4994 | 0.1524 | 106.1 | 3.00 | 60.96 | Dry | Flank wear exceeds 0.4064 mm |

Figure 5:
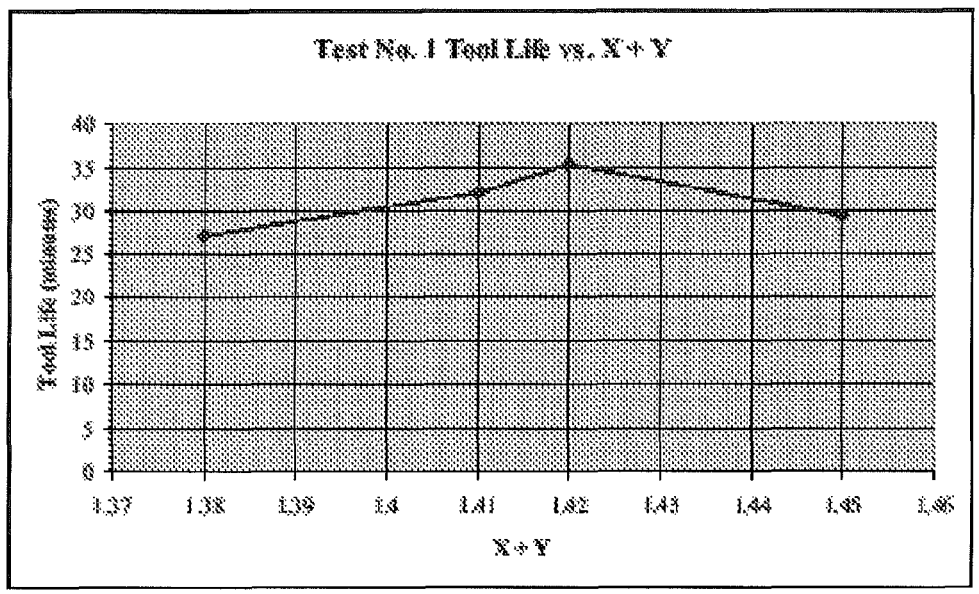
FIG. 5 is a plot of the Test No. 1 turning tool life results as a function of the sum of the x in the formula $(Ti_xAl_{1-x})N$ and of the y in the formula $(Ti_ySi_{1-y})N$.
Figure 6:
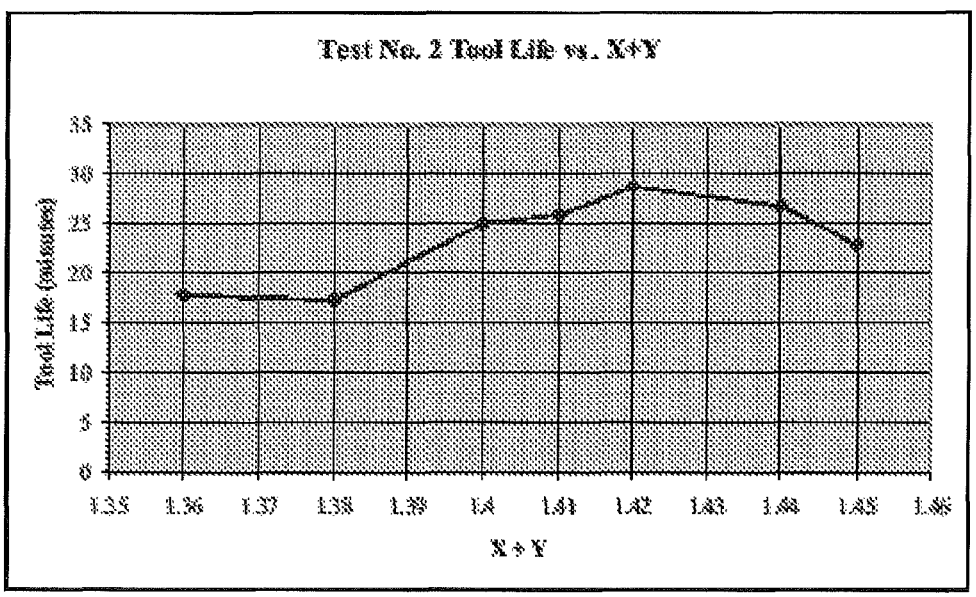
FIG. 6 is a plot of the Test No. 2 turning tool life results as a function of the sum of the x in the formula $(Ti_xAl_{1-x})N$ and the y in the formula $(Ti_ySi_{1-y})N$.

The results of these tests are given in Table 5. As can be seen in that table, the hard coatings of the present invention exhibit improvements in tool life over the comparison hard coating in both turning and milling. The results of the turning tests, Test No. 1 and Test No. 2, are plotted in FIGS. 5 and 6, respectively, as a function of the sum the x in the formula $(Ti_xAl_{1-x})N$ and of the y in the formula $(Ti_ySi_{1-y})N$. The plots illustrate that this sum strongly influences the tool life. From the trends established in these plots, it is apparent that the tool life of the hard coating is surprisingly better when the sum is in the range of 1.38 to 1.46.

TABLE 5

| ID | Sum of X + Y for Second Layer Subgroups | Test No. 1 Tool Life (minutes) | Test No. 2 Tool Life (minutes) | Test No. 3 Tool Life (minutes) |
|---|---|---|---|---|
| Example 1 | 1.41 | 32.1 | 25.9 | (not tested) |
| Example 2 | 1.38 | 27.1 | 17.4 | (not tested) |
| Example 3 | 1.45 | 29.3 | 22.9 | 12 |
| Example 4 | 1.42 | 35.4 | 28.7 | 9 |
| Example 5 | 1.36 | (not tested) | 17.8 | (not tested) |
| Example 6 | 1.40 | (not tested) | 25.0 | (not tested) |
| Example 7 | 1.44 | (not tested) | 26.7 | (not tested) |
| Comparison | (not applicable) | 12.5 | 18.3/20.8 | 6.9 |

While only a few embodiments of the present invention have been shown and described, it will be obvious to those skilled in the art that many changes and modifications may be made thereunto without departing from the spirit and scope of the present invention as described in the following claims. All patent applications, patents, and all other publications referenced herein are incorporated herein in their entireties to the full extent permitted by law.

What is claimed is:

1. A hard coating for a substrate comprising:
    a first layer deposited by physical vapor deposition comprising $(Ti_zAl_{1-z})N$, wherein $0.4 \leq z \leq 0.6$; and
    a second layer deposited by physical vapor deposition having a plurality of sublayer groups, a sublayer group comprising a first sublayer of $(Ti_ySi_{1-y})N$, wherein $0.85 \leq y \leq 0.98$, and a second sublayer of $(Ti_xAl_{1-x})N$, wherein $0.4 \leq x \leq 0.6$;
    wherein neither a pure silicon phase nor a pure silicon nitride phase is present in the first sublayer and the sum or x and y is in the range of 1.38 to 1.46.

2. The hard coating of claim 1, wherein the first layer accounts for 20 to 60 percent of the overall coating thickness.

3. The hard coating of claim 1, wherein the thickness of the sublayer group is in the range of 3 to 20 nm.

4. The hard coating of claim 1, wherein the sublayer groups are adjacently stacked.

5. The hard coating of claim 1, wherein x and z are substantially equal in value.

6. The hard coating of claim 1, wherein x and z are different in value.

7. The hard coating of claim 1, wherein the $(Ti_zAl_{1-z})N$ of the first layer Comprises hexagonal close-packed phase in addition to face-centered cubic phase.

8. The hard coating of claim 1, wherein the $(Ti_xAl_{1-x})N$ of at least one second sublayer comprises hexagonal close-packed phase in addition to face-centered cubic phase.

9. The hard coating of claim 1, wherein a sublayer group has a ratio of thickness of the first sublayer to thickness of the second sublayer in a range of 0.2 to 2.0.

10. The hard coating of claim 1, wherein the sum of x and y is in the range of 1.39 to 1.45.

11. The hard coating of claim 1, having a thickness of 2 to 6 μm.

12. The hard coating of claim 1, wherein the first layer and the second layer are adjacent to one another.

13. The hard coating of claim 1 further comprising one or more additional layers comprising TiN or CrN.

14. The hard coating of claim 13 wherein a TiN layer is interposed between the substrate and the first layer.

15. The hard coating of claim 1 further comprising one or more additional layers selected from the group consisting of TiAlCrN, AlCrN, TiAlSiN, AlCrSiN and TiAlCrSiN.

16. The hard coating of claim 1 having a hardness according to ISO 14577 of 30.8 GPa to 33.6 GPa.

17. A hard coated article comprising:
an article having a surface; and
a hard coating covering at least a portion of the surface, the hard coating comprising:
a first layer deposited by physical vapor deposition comprising $(Ti_zAl_{1-z})N$, wherein $0.4 \leq z \leq 0.6$; and
a second layer deposited by physical vapor deposition having a plurality of sublayer groups, a sublayer group comprising a first sublayer of $(Ti_ySi_{1-y})N$, wherein $0.85 \leq y \leq 0.98$, and a second sublayer of $(Ti_xAl_{1-x})N$, wherein $0.4 \leq x \leq 0.6$;
wherein neither a pure silicon phase nor a pure silicon nitride phase is present in the first sublayer and the sum or x and y is in the range of 1.38 to 1.46.

18. The hard coated article of claim 17, wherein the first layer accounts for 20 to 60 percent of the overall coating thickness.

19. The hard coated article of claim 17, wherein the thickness of the sublayer group is in the range of 3 to 20 nm.

20. The hard coated article of claim 17, wherein the sublayer groups are adjacently stacked.

21. The hard coated article of claim 17, wherein x and z are substantially equal in value.

22. The hard coated article of claim 17, wherein x and z are different in value.

23. The hard coated article of claim 17, wherein the $(Ti_zAl_{1-z})N$ of the first layer comprises hexagonal close-packed phase in addition to face-centered cubic phase.

24. The hard coated article of claim 17, wherein the $(Ti_xAl_{1-x})N$ of at least one second sublayer comprises hexagonal close-packed phase in addition to face-centered cubic phase.

25. The hard coated article of claim 17, wherein a sublayer group has a ratio of thickness of the first sublayer to thickness of the second sublayer in a range of 0.2 to 2.0.

26. The hard coated article of claim 17, wherein the sum of x and y is in the range of 1.39 to 1.45.

27. The hard coated article of claim 17, wherein the first layer and the second layer are adjacent to one another.

28. The hard coated article of claim 17 further comprising one or more additional layers comprising TiN or CrN.

29. The hard coated article of claim 17 further comprising one or more additional layers selected from the group consisting of TiAlCrN, AlCrN, TiAlSiN, AlCrSiN and TiAlCrSiN.

30. The hard coated article of claim 17, wherein the article is selected from the group consisting of a cutting tool and a wear component.

31. The hard coated article of claim 30, wherein the article is selected from the group consisting of drills, end mills and indexable cutting inserts.

32. The hard coated article of claim 17, wherein the article comprises cemented carbide, cermet, steel, cubic boron nitride, polycrystalline diamond, silicon nitride, alumina or titanium aluminum nitride.

* * * * *